United States Patent [19]

Teong

[11] Patent Number: 5,639,692
[45] Date of Patent: Jun. 17, 1997

[54] NON-ETCH BACK SOG PROCESS USING A METAL VIA STUD

[75] Inventor: Jennifer Su Ping Teong, Mount Sinai Rise, Singapore

[73] Assignee: Chartered Semiconductor Manufacturing Pte, Ltd., Singapore, Singapore

[21] Appl. No.: 629,954

[22] Filed: Apr. 8, 1996

[51] Int. Cl.$^6$ .............. H01L 21/44; H01L 21/48
[52] U.S. Cl. .............. 437/195; 437/190; 437/192; 437/194; 156/643
[58] Field of Search .............. 487/195, 190, 487/192, 194, 228, 231; 156/643

[56] References Cited

U.S. PATENT DOCUMENTS

| | | | |
|---|---|---|---|
| 4,410,622 | 10/1983 | Dalal et al. | 430/312 |
| 4,670,091 | 6/1987 | Thomas et al. | 156/643 |
| 4,917,759 | 4/1990 | Fisher et al. | 156/643 |
| 4,954,423 | 9/1990 | McMann et al. | 430/316 |
| 5,132,775 | 7/1992 | Brighton et al. | 357/71 |
| 5,312,512 | 5/1994 | Allman et al. | 156/636 |
| 5,354,713 | 10/1994 | Kin et al. | 437/195 |
| 5,436,199 | 7/1995 | Brighton | 437/190 |

*Primary Examiner*—Charles L. Bowers, Jr.
*Assistant Examiner*—Lynne A. Gurley
*Attorney, Agent, or Firm*—George O. Saile

[57] ABSTRACT

A process has been developed in which planar, multilevel metallizations, are used to fabricate semiconductor devices. The process features initially forming tall, narrow metal via stud structures, and filling the spaces between the metal via stud structures with a planarizing layer of a composite dielectric, which includes a spin on glass layer. The composite dielectric was deposited by initially using a non-porous, silicon oxide layer, followed by the planarizing spin on glass layer. Therefore metal via fills will interface the non-porous, silicon oxide layer.

19 Claims, 4 Drawing Sheets

5,639,692

NON-ETCH BACK SOG PROCESS USING A METAL VIA STUD

BACKGROUND OF THE INVENTION

1. Field of the Invention

This present invention relates to the fabrication methods used to produce semiconductor devices, and more specifically to methods used for forming and passivating metal filled vias, and planarizing using spin on glass, (SOG), chemical mechanical polishing, (CMP), processes.

2. Description of Prior Art

A major objective of the semiconductor industry has been to continually improve device performance while still maintaining, or decreasing, the manufacturing cost of the specific semiconductor chip. This objective has been, in part, realized by the trend to micro-miniaturazation. The ability to fabricate semiconductor devices with sub-micron features, has allowed both the performance and cost objectives to be met. Smaller features positively influence performance by decreasing parasitic capacitances, as well as decreasing specific performance degrading resistances. In addition micro-miniaturazation has resulted in a decrease in chip size, thus enabling more chips to be placed on a specific size, starting silicon substrate, thus reducing the processing cost for a specific chip.

Micro-miniaturization has been accomplished by advances in several key semiconductor fabrication disciplines such as photolithography and reactive ion etching, (RIE). For example more sophisticated exposure cameras, as well as the development of more sensitive photoresist materials, have allowed sub-micron images to be routinely created in photoresist materials. In addition similar advances in anisotropic, dry etching processes, have allowed the sub-micron images in photoresist to be successfully transferred to underlying semiconductor materials. However smaller features, such as narrower metal interconnect lines, along with smaller spaces between interconnect lines, can result in difficulties in obtaining planar surfaces, which are needed to create successful subsequent upper level wiring lines. In addition to maintain the desired conductivity of the narrower metal lines, the height of the metal line has to be increased. This results in a higher aspect ratio than for counterparts fabricated with wider, thinner metal lines, again adding to the difficulties in filling the narrow spaces with insulator.

One method used by the semiconductor industry to fill narrow spaces, between metal lines, is a spin on glass, (SOG), process. Unlike more conventional insulator deposition processes, such as low pressure chemical vapor deposition, (LPCVD), or plasma enhanced chemical vapor deposition, (PECVD), where conformal coverage of the metal line with the deposited insulator still leaves a severe topography for subsequent wiring processes, the SOG process fills these narrow spaces, and after applying subsequent planarazation techniques, results a planar topography. Prior art has shown SOG applications, such as Kim, et al, in U.S. Pat. No. 5,354,713, as well as Fisher, et al, in U.S. Pat. No. 4,917,759. However these applications, although resulting in the desired planarity, also result in the SOG layer being exposed during subsequent metal depositions. The characteristics of the SOG layer include outgassing of incorporated oxygen or moisture during a hot metal deposition process. This outgassing, if occurring near an existing metal structure or via, can result in metal properties, such as increased resistivity, due to the reaction with the SOG outgassing components.

This invention will describe a process for achieving planar topographies, using a SOG process to fill narrow spaces between metal via studs. However this invention will show SOG planarization processes, and encapsulation techniques, used to prevent SOG outgassing from adversely influencing existing metal structures during subsequent metal depositions, even depositions at elevated temperatures, such as hot aluminum depositions.

SUMMARY OF THE INVENTION

It is object of this invention to use a metal via stud to interconnect underlying and overlying metal structures.

It is another object of this invention to use a SOG layer, as part of the composite insulator layer, between metal via studs, for purposes of supplying a planar topography.

It is still another object of this invention to encapsulate most of the exposed SOG surface with a less porous dielectric layer, prior to deposition of an overlying metallization layer.

It is still yet another object of this invention to use a chemical mechanical polishing procedure to planarize the composite insulator layer, and to expose the top surface of a metal via stud.

In accordance with the present invention a method is described for fabricating semiconductor devices, exhibiting planar metallization and insulation levels, via the use of insulator composites, featuring SOG layers. A first metal interconnect structure, contacting underlying silicon device elements, is coated with a metal layer. Photolithographic and reactive ion etching processes are performed to the metal layer to create a metal via stud on the underlying first metal interconnect structure. A thin interlevel dielectric layer is deposited, conformally covering the metal via studs. A spin on glass, (SOG), layer is next deposited on the thin interlevel metal dielectric, for purposes of filling the spaces between metal via studs, and creating a smoother topography. The structure, including the SOG layer, is next subjected to a bake out and curing process, for purposes of densifying the SOG layer. Another dielectric layer is deposited on the cured SOG layer followed by chemical mechanical polishing to completely planarize the structure, stopping at a point where the top of the metal via studs are exposed. Deposition of a metal layer and a anti-reflective coating layer are performed, followed by photolithographic and reactive ion patterning, creating an overlying second metal interconnect structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of forming a planar topography, using a SOG layer to fill the spaces between metal via studs, will be covered in detail. This process can be used for the fabrication of metal oxide semiconductor field effect transistors, (MOSFET), devices that are currently being manufactured in industry, therefore only the specific areas unique to understanding this invention will be described in detail.

Figure 1:
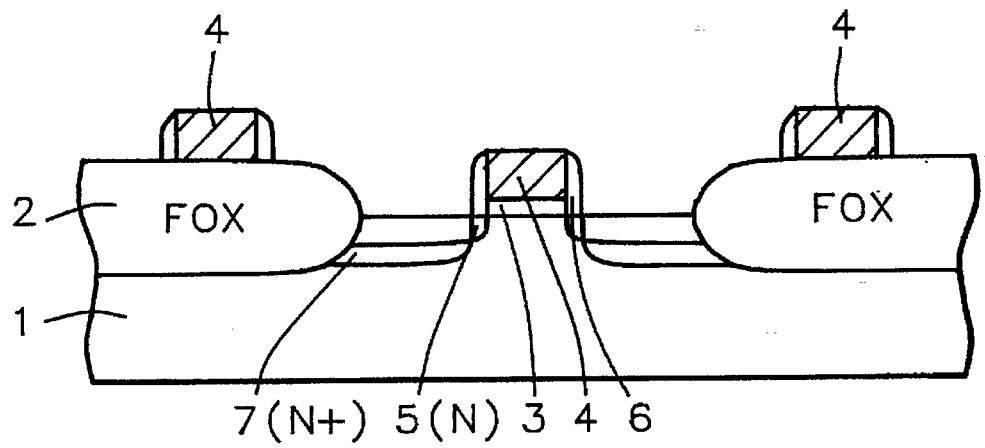
FIGS. 1–2, which schematically in cross-sectional style show the stages of fabrication prior to forming the metal via stud.

FIG. 1, shows a typical, N channel, (NFET), device, where a process exhibiting a planar topography, via use of a SOG layer, will be used to fabricate reliable interconnect metallizations. A substrate, 1, composed of P type, single crystalline silicon, with a <100> orientation, is used. A thick field oxide, 2, (FOX), is formed surrounding the region where the device will be built. Briefly the method used to produce the FOX insulator is to create an oxidation mask of an overlying $Si_3N_4$ layer, and an underlying $SiO_2$ layer. Conventional photolithographic and RIE processes are used to create the mask shape. After photoresist removal, and careful wet cleans, the FOX region is created in the unmasked, non-device regions, via a thermal oxidation in an oxygen—steam ambient, at a temperature between about 800° to 1000° C., to achieve FOX thickness between about 4000 to 7000 Angstroms. After removal of the oxidation masking layers, hot phosphoric acid for the $Si_3N_4$ layer and a buffered hydrofluoric acid solution for the underlying $SiO_2$ layer, a thin $SiO_2$, gate insulator, 3, is grown in an oxygen—steam ambient, at a temperature between about 800° to 1000° C., to a thickness between about 65 to 300 Angstroms. A layer of polysilicon is than deposited, using LPCVD processing, at a temperature between about 500° to 700° C., to a thickness between about 1500 to 4000 Angstroms. The polysilicon is than doped via an ion implantation of phosphorous, at an energy between about 25 to 100 Kev., at a dose between about 1E14 to 1E16 atoms/cm$^2$. Another alternative is to use a polycide gate structure, consisting of a tungsten silicide layer, chemically vapor deposited to a thickness between about 1500 to 2500 Angstroms, and capped with a chemically vapor deposited polysilicon layer, at a thickness between about 500 to 1000 Angstroms. However for this invention the polysiticon gate structure will be used. Photolithographic and anisotropic RIE processes, using $Cl_2$ as an etchant, are used to create polysilicon gate structures, 4, shown in FIG. 1. After photoresist removal, using plasma oxygen ashing, and careful wet cleans, a blanket ion implantation is performed, using phosphorous or arsenic, at an energy between about 30 to 100 Kev., at a dose between about 1E12 to 1E13 atoms/cm$^2$, used to create lightly doped source and drain regions, 5. Next sidewall spacer, 6, is created. The spacer is obtained by initially depositing a layer of silicon oxide, via either PECVD or LPCVD processing, at a temperature between about 400° to 925° C., to a thickness between about 1000 to 4000 Angstroms, followed by an anisotropic RIE procedure, using for example a species like $CHF_3$ as an etchant. A blanket ion implantation step is again performed, using arsenic, at an energy between about 30 to 100 Kev., at a dose between about 1E13 to 1E16 atoms/cm$^2$, used to create source and drain regions, 7, shown schematically in FIG. 1.

Figure 2:
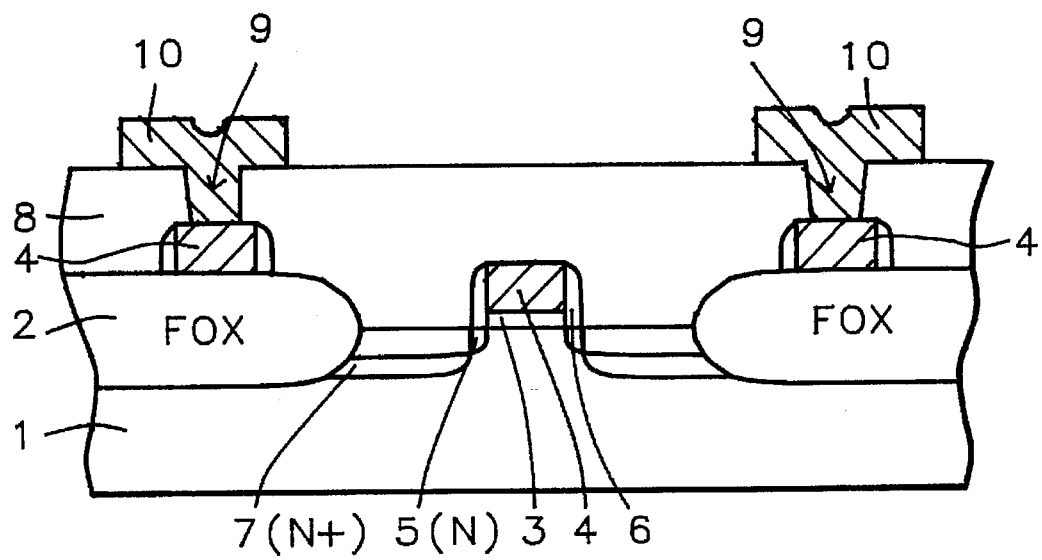

Another composite layer of undoped, or doped silicon oxide, 8, is deposited using PECVD, LPCVD, or atmospheric pressure chemical vapor deposition, (APCVD), processing, at a temperature between about 400° to 700° C., to a thickness between about 8000 to 12000 Angstroms, followed by a chemical mechanical polishing procedure, resulting in about 7000 Angstroms of a planar silicon oxide layer, 8, remaining. A first via hole, 9, is opened in composite silicon oxide layer, 8, to expose the surface of polysilicon gate structure, 4, or the surface of the source and drain region, 7, using standard photolithographic and RIE procedures. For this invention the via hole, 9, will be shown opened to only to polysilicon gate structure, 4. The selective, RIE procedure was performed using $CHF_3$ as an etchant. After photoresist removal, accomplished by using a plasma oxygen ashing process, followed by careful wet cleans, a first level metallization is performed. The first level metallization may be composed of an adhesion layer of titanium, followed by a barrier layer of titanium nitride, followed by an r.f. deposited layer of an aluminum-copper alloy. The aluminum-copper alloy is deposited using r.f. sputtering, to a thickness between about 4000 to 10000 Angstroms, with an overlying titanium nitride anti-reflective, (ARC), layer. Again conventional photolithographic and RIE processing, using for example a $Cl_2$ etchant, are employed to create first level metal structure, 10, shown in FIG. 2. Plasma oxygen ashing, followed by careful wet cleans, are again used to remove the photoresist image used to define first level metal structure, 10.

Figure 3:
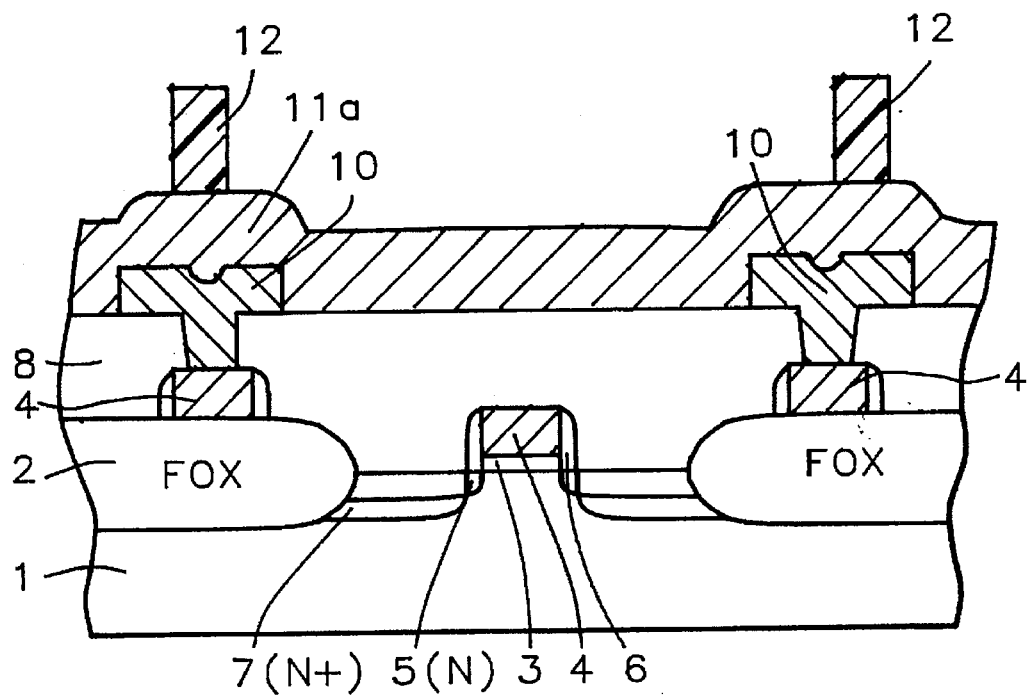
FIGS. 3–4, which schematically, in cross-sectional style, show the stages of formation of the metal via stud.
Figure 4:
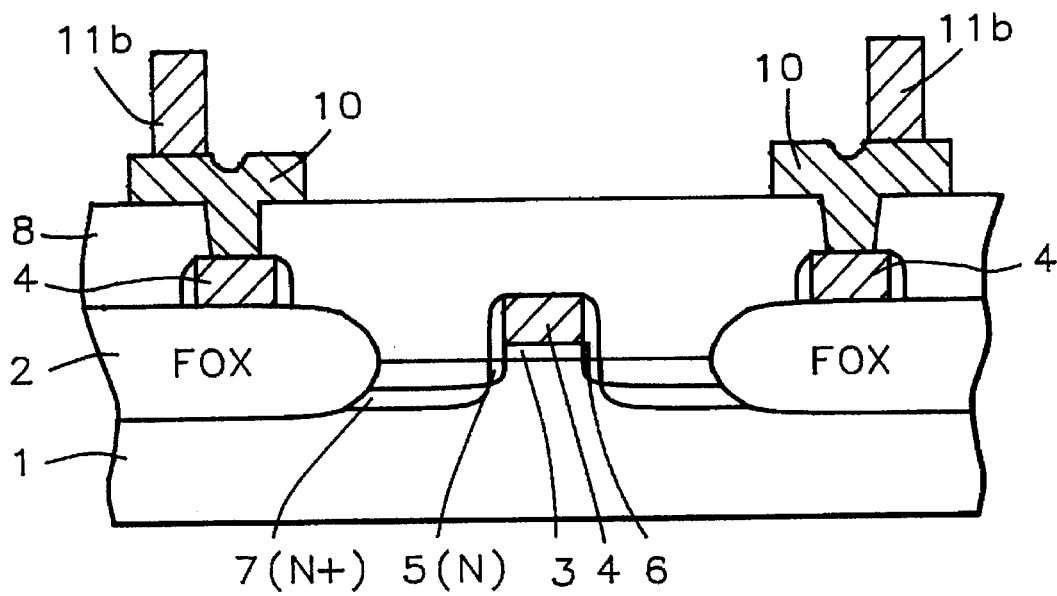

A metallization layer, 11a, of tungsten, is next deposited, via LPCVD processing, at a temperature between about 400 to 600° C., to a thickness between about 4000 to 12000 Angstroms. Metallization layer, 11a, can also be any metallization that when patterned using RIE processing, allows a RIE etch stop, or differences in RIE removal rates to exist between the metal and the underlying titanium nitride, ARC layer, or the underlying silicon oxide layer. Photolithographic procedures are next employed to form photoresist shape, 12, shown schematically in FIG. 3. Photoresist shape, 12, which will define the subsequent metal via stud, is formed using a photolithographic, step and repeat reticle, that is the complement of the reticle normally used to create a via hole shape in an insulator layer image. Photoresist shape, 12, is between about 0.4 to 3.0 uM, in diameter. Reactive ion etching, using photoresist shape, 12, as a mask, is used to create metal via stud, 11b. The RIE process is performed using $Cl_2$ as an etchant. Metal via stud, 11b, is created to a diameter between about 0.4 to 3.0 uM, and between about 4000 to 12000 Angstroms in height, and is shown schematically in FIG. 4, after photoresist removal using plasma oxygen ashing and careful wet cleans.

Figure 5:
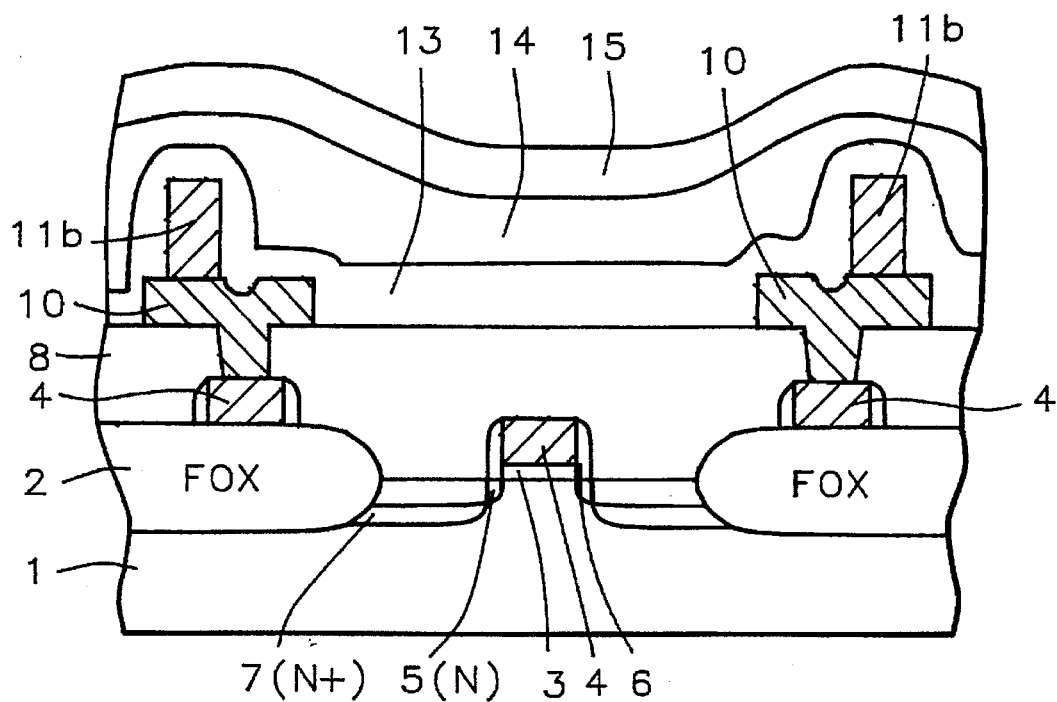
FIGS. 5–6, which schematically, in cross-sectional style, show the process stages used to create a planar topography.

A first interlevel dielectric layer, 13, of silicon oxide, is deposited, using PECVD processing, at a temperature between about 200° to 450° C., to a thickness between about 500 to 3000 Angstroms. The first interlevel dielectric layer, 13, will be used to passivate and protect metal via stud, 11b, from subsequent processes and materials. However first interlevel dielectric layer, 13, does not result in complete filling of the spaces between metal via studs, 11b, and by itself can not produce a planar topography for subsequent overlying metallization levels. Therefore a layer of spin on glass, (SOG), 14, is applied, using conventional coating methods, to a thickness between about 3000 to 7000 Angstroms. The SOG layer, 14, is subjected to a bake out at a temperature between about 100° to 200° C., and curing, at a temperature between about 250° to 450° C., for purpose of removing incorporated, volatile components from the SOG layer. These process sequences, shown schematically in FIG. 5, indicate the near complete filling of the spaces between metal via studs, 11b. It is also important that the metal via studs, 11b, interface first dielectric layer, 13, rather than interface the less dense SOG layer, 14. A second interlevel dielectric layer, 15, of silicon oxide, is now deposited using PECVD processing, at a temperature between about 200° to 450° C., to a thickness between about 6000 to 12000 Angstroms, also shown in FIG. 5. This layer is used to completely fill the spaces between metal via studs, as well as encapsulate most of the SOG layer, 14, to reduce the level of outgassing form SOG layer, 14, during subsequent processing.

Figure 6:
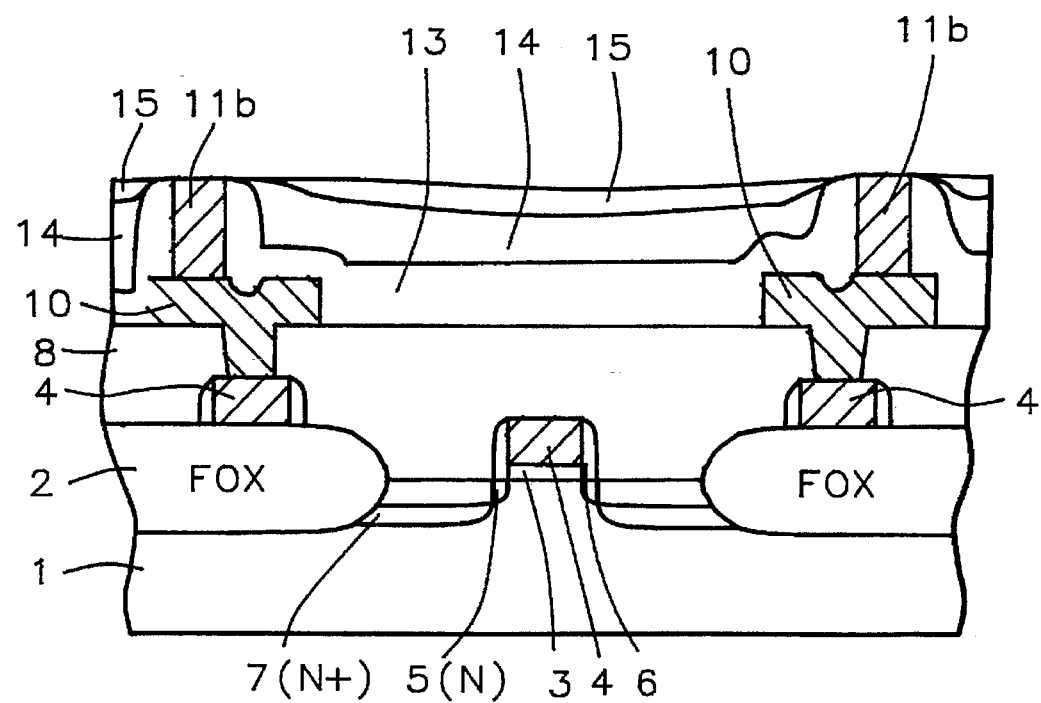

A critical chemical mechanical polishing, (CMP), procedure is next used to create the desired surface planarity, shown schematically in FIG. 6. The CMP process, using conventional methods, is performed to a point in which the top surface of metal via stud, 11b, is exposed. If reactive ion etching procedures were employed to etch back the insulator layers, to expose metal via stud, 11b, evolution of volatile components from the exposed portions of the SOG layer, 14, may react with the top surface of metal via stud, 11b, possibly degrading the interface resistance between metal via stud, 11b, and a subsequent overlying metallization structure.

Figure 7:
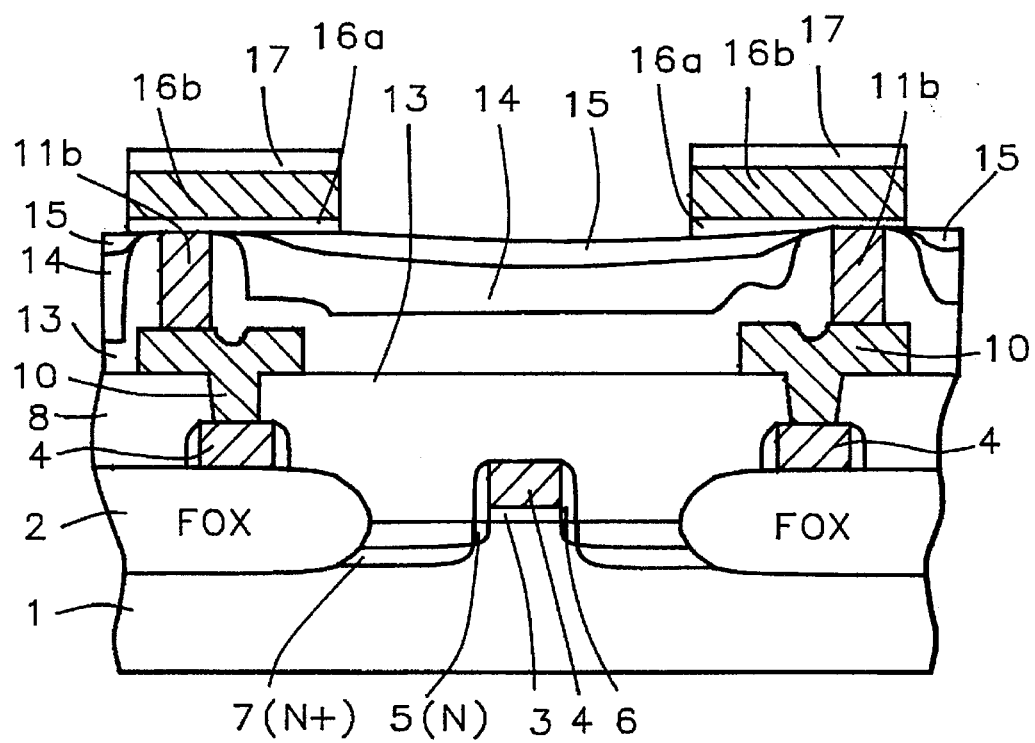
FIGS. 7, which schematically, in cross-sectional style, shows the formation of an overlying metallization structure, on a planar, underlying topography.

A barrier metallization composite layer, 16a, of underlying titanium, at a thickness between about 300 to 1000 Angstroms, and titanium nitride, at a thickness between about 200 to 1000 Angstroms, is deposited via r.f. sputtering procedures, followed by the deposition of an aluminum based layer, 16b, containing between about 0.5 to 2% copper, again using r.f. sputtering, and to a thickness between about 4000 to 10000 Angstroms. Next another r.f. sputtered deposition of a titanium nitride layer, 17, is performed for purposes of using this layer as an anti-reflective coating for subsequent photolithographic procedures. The titanium nitride layer, 17, is deposited to a thickness between about 200 to 1000 Angstroms. The aluminum based metallization can be performed at elevated temperatures, which allows optimum metal characteristics, such as resistivity and conformality, to be achieved. This is now possible since most of SOG layer was not exposed during the deposition. Conventional photolithographic and RIE procedures, using for example, $Cl_2$ as an etchant, are performed to create the second level metal structure, consisting of the titanium nitride, anti reflective layer, 17, and the underlying aluminum-copper layer, 16b, and barrier layers, 16a. Photoresist removal is again accomplished via plasma oxygen ashing and careful wet cleans. The resulting second level metal structure is shown schematically in FIG. 7.

This process of using a SOG layer to create planar topographies for subsequent metallization levels, although shown being applied to an N channel MOSFET device, can be applied to a P channel, (PFET), device, a complimentary, (CMOS), device, or a BiCMOS, (bipolar-CMOS), device.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a MOSFET device on a semiconductor substrate, using a spin on glass insulator, as part of a composite insulator, to fill the space between metal via stud structures, comprising the steps of:

providing the elements of said MOSFET device;

depositing a first insulator layer on said semiconductor substrate, including on said elements of said MOSFET device;

opening via holes in said first insulator layer, to expose top surfaces of said elements of said MOSFET device;

depositing a first metallization layer, in said via holes, including depositing on the exposed top surface, of said element of said MOSFET device, and on a surface of said first insulator layer;

patterning said first metallization layer to form first level metal structures, and providing contact to said elements of said MOSFET device;

a second depositing a second metallization layer on said first level metal structures, and on a top surface of said first insulator layer, not covered by said first level metal structures;

patterning said second metallization layer to form metal via stud structures on a top surface of said first level metal structures, said first level metal structures underlying said metal via stud structures;

depositing a first interlevel dielectric layer on exposed surfaces of said metal via stud structures, as well as on exposed surfaces of said first level metal structures, and on said first insulator layer, not covered by said first level metal structures;

applying a spin on glass layer on said first interlevel dielectric layer, partially filling spaces between said metal via stud structures;

heat treating said spin on glass layer;

curing said spin on glass layer;

depositing a second interlevel dielectric layer on said spin on glass layer, completely filling spaces between said metal via stud structures;

chemical mechanical polishing to expose a top surface of said metal via stud structures, and planarizing, an exposed surface of said first interlevel dielectric layer, an exposed surface of said spin on glass layer, and an exposed surface of said second interlevel dielectric layer, in spaces between said metal via stud structures;

depositing a third metallization layer, on the exposed top surface of said metal via structures, on the exposed surface of said first interlevel dielectric layer, on the exposed surface of said spin on glass layer, and on the exposed surface of said second interlevel dielectric layer;

depositing a anti-reflective layer on said third metallization layer; and patterning said anti-reflective layer, and said third metallization layer, to form second level metal structures, overlying said metal via stud structure.

2. The method of claim 1, wherein said first metallization layer is aluminum, containing between about 0.5 to 2.0% copper, and between about 0.5 to 1% silicon, deposited using r.f. sputtering, to a thickness between about 4000 to 10000 Angstroms.

3. The method of claim 1, wherein said second metallization layer is tungsten, deposited using LPCVD processing, at a temperature between about 400° to 600° C., to a thickness between about 4000 to 12000 Angstroms.

4. The method of claim 1, wherein said metal via stud structures are formed via reactive ion etching, using $Cl_2$ as an etchant, wherein each of said metal via stud structures has a diameter between about 0.4 to 3.0 uM, and a height between about 4000 to 12000 Angstroms.

5. The method of claim 1, wherein said first interlevel dielectric layer is silicon oxide, deposited using PECVD processing, at a temperature between about 200° to 450° C., to a thickness between about 500 to 3000 Angstroms.

6. The method of claim 1, wherein said spin on glass layer is applied at a temperature between about 20° to 25° C., to a thickness between about 3000 to 7000 Angstroms.

7. The method of claim 1, wherein said spin on glass is heat-treated at a temperature between about 100° to 200° C., for a time between about 10 to 50 min., using hot plates, and cured using conventional ovens, at a temperature between about 250° to 450° C.

8. The method of claim 1, wherein said second interlevel dielectric layer is silicon oxide, deposited using PECVD processing, at a temperature between about 200° to 450° C., to a thickness between about 6000 to 12000 Angstroms.

9. The method of claim 1, wherein said chemical mechanical polishing is performed using a silica slurry.

10. A method for fabricating a MOSFET device, on a semiconductor substrate, with a planarized topography, by using a spin on glass, as part of a composite insulator, to fill spaces between metal via stud structures, comprising the steps of:

providing polysilicon gate structures, of said MOSFET device;

depositing a first insulator layer on said semiconductor substrate, including depositing on said polysilicon gate structure;

opening via holes in said first insulator layer to expose top surfaces of said polysilicon gate structures;

depositing an aluminum based, first metallization layer, in said via holes, including depositing on an exposed top surface of said polysilicon gate structure, and on a surface of said first insulator layer;

patterning said aluminum based, first metallization layer to form first level, aluminum based metal structures;

depositing a second metallization layer on said first level, aluminum based metal structure, and on said first insulator layer, not covered by said first level, aluminum based metal structures;

patterning said second metallization layer to form a metal via stud structures on a top surface of said first level, aluminum based metal structures;

depositing a first silicon oxide interlevel layer on exposed surfaces of said metal via stud structures, as well as on exposed surfaces of said first level, aluminum based metal structures, and on said first insulator layer, not covered by said first level, aluminum based metal structures;

applying said spin on glass layer on said first silicon oxide interlevel layer, partially filling spaces between said metal via stud structures;

heat treating said spin on glass layer;

curing said spin on glass layer;

depositing of a second silicon oxide interlevel layer on said spin on glass layer, completely filling spaces between said metal via stud structures;

chemical mechanical polishing to expose a top surface of said metal via stud structures, while planarizing a surface of exposed said first silicon oxide interlevel layer, a surface of exposed said spin on glass layer, and a surface of exposed said second silicon oxide interlevel layer, in spaces between said metal via stud structures;

depositing an aluminum based, third metallization layer on the top surface of said metal via stud structure, and on the exposed top surface of said first silicon oxide interlevel layer, on the exposed top surface of the spin on glass layer, and on the exposed top surface of said second silicon oxide interlevel layer;

depositing an anti-reflective layer on said aluminum based, third metallization layer; and patterning said anti-reflective layer, and said aluminum based, third metallization layer, to form second level aluminum based metal structures.

11. The method of claim 10, wherein said aluminum based, first metallization layer, is deposited using r.f. sputtering, to a thickness between about 6000 to 10000 Angstroms, containing between about 0.5 to 2% copper, and between about 0.5 to 1% silicon.

12. The method of claim 10, wherein said second metallization layer is tungsten, deposited using LPCVD processing, at a temperature between about 400° to 600° C., to a thickness between about 4000 to 12000 Angstroms.

13. The method of claim 10, wherein said metal via stud structures are formed using reactive ion etching, using $Cl_2$ as an etchant, wherein each of said metal via stud structures has a diameter between about 0.4 to 3.0 uM, and a height between about 4000 to 12000 Angstroms.

14. The method of claim 10, wherein said first silicon oxide interlevel layer is deposited using PECVD processing, at a temperature between about 200° to 450° C., to a thickness between about 500 to 3000 Angstroms.

15. The method of claim 10, wherein said spin on glass layer is applied at a temperature between about 20° to 25° C., to a thickness between 3000 to 7000 Angstroms.

16. The method of claim 10, wherein said spin on glass layer is heat-treated at a temperature between 100° to 200° C., for a time between about 10 to 50 mins., using hot plates, and cured using conventional oven processing, at a temperature between about 250° to 450° C.

17. The method of claim 10, wherein said second silicon oxide interlevel layer is deposited using PECVD processing, at a temperature between about 200° to 450° C., to a thickness between about 6000 to 12000 Angstroms.

18. The method of claim 10, wherein said chemical mechanical polishing is performed using a silica slurry.

19. The method of claim 10, wherein said aluminum based, third metallization layer, is deposited using r.f. sputtering, at a temperature between about 22° to 550° C., to a thickness between about 4000 to 10000 Angstroms, containing between about 0.5 to 2.0% copper.

* * * * *